(12) United States Patent
Pueschner et al.

(10) Patent No.: US 9,548,248 B2
(45) Date of Patent: Jan. 17, 2017

(54) METHOD OF PROCESSING A SUBSTRATE AND A METHOD OF PROCESSING A WAFER

(71) Applicant: Infineon Technologies AG, Neubiberg (DE)

(72) Inventors: Frank Pueschner, Kelheim (DE); Bernhard Schaetzler, Regensburg (DE); Franz Gabler, Lappersdorf (DE)

(73) Assignee: INFINEON TECHNOLOGIES AG, Neubiberg (DE)

(*) Notice: Subject to any disclaimer, the term of this patent is extended or adjusted under 35 U.S.C. 154(b) by 43 days.

(21) Appl. No.: 14/453,639

(22) Filed: Aug. 7, 2014

(65) Prior Publication Data

US 2016/0042998 A1 Feb. 11, 2016

(51) Int. Cl.
*H01L 21/82* (2006.01)
*H01L 21/302* (2006.01)
*H01L 21/304* (2006.01)
*H01L 21/56* (2006.01)
*H01L 23/31* (2006.01)

(52) U.S. Cl.
CPC ............. *H01L 21/82* (2013.01); *H01L 21/302* (2013.01); *H01L 21/561* (2013.01); *H01L 23/3114* (2013.01); *H01L 2924/0002* (2013.01)

(58) Field of Classification Search
CPC .... H01L 21/82; H01L 23/3114; H01L 21/302; H01L 21/304; H01L 21/3043; H01L 21/561; H01L 21/563
See application file for complete search history.

(56) References Cited

U.S. PATENT DOCUMENTS

2005/0194670 A1* 9/2005 Kameyama ....... H01L 21/76898
257/678

* cited by examiner

*Primary Examiner* — Thanhha Pham
(74) *Attorney, Agent, or Firm* — Viering, Jentschura & Partner mbB

(57) ABSTRACT

According to various embodiments, a method of processing a substrate may include: forming a plurality of trenches into a substrate between two chip structures in the substrate, the trenches defining at least one pillar between the two chip structures and a sidewall on each of said two chip structures; disposing an auxiliary carrier on the substrate to hold the chip structures and the at least one pillar; at least partially filling the trenches with encapsulation material to cover the at least one pillar and the sidewalls, thereby at least partially encapsulating the chip structures; removing a portion of the encapsulation material to expose at least a portion of the at least one pillar; and at least partially removing the at least one pillar.

19 Claims, 11 Drawing Sheets

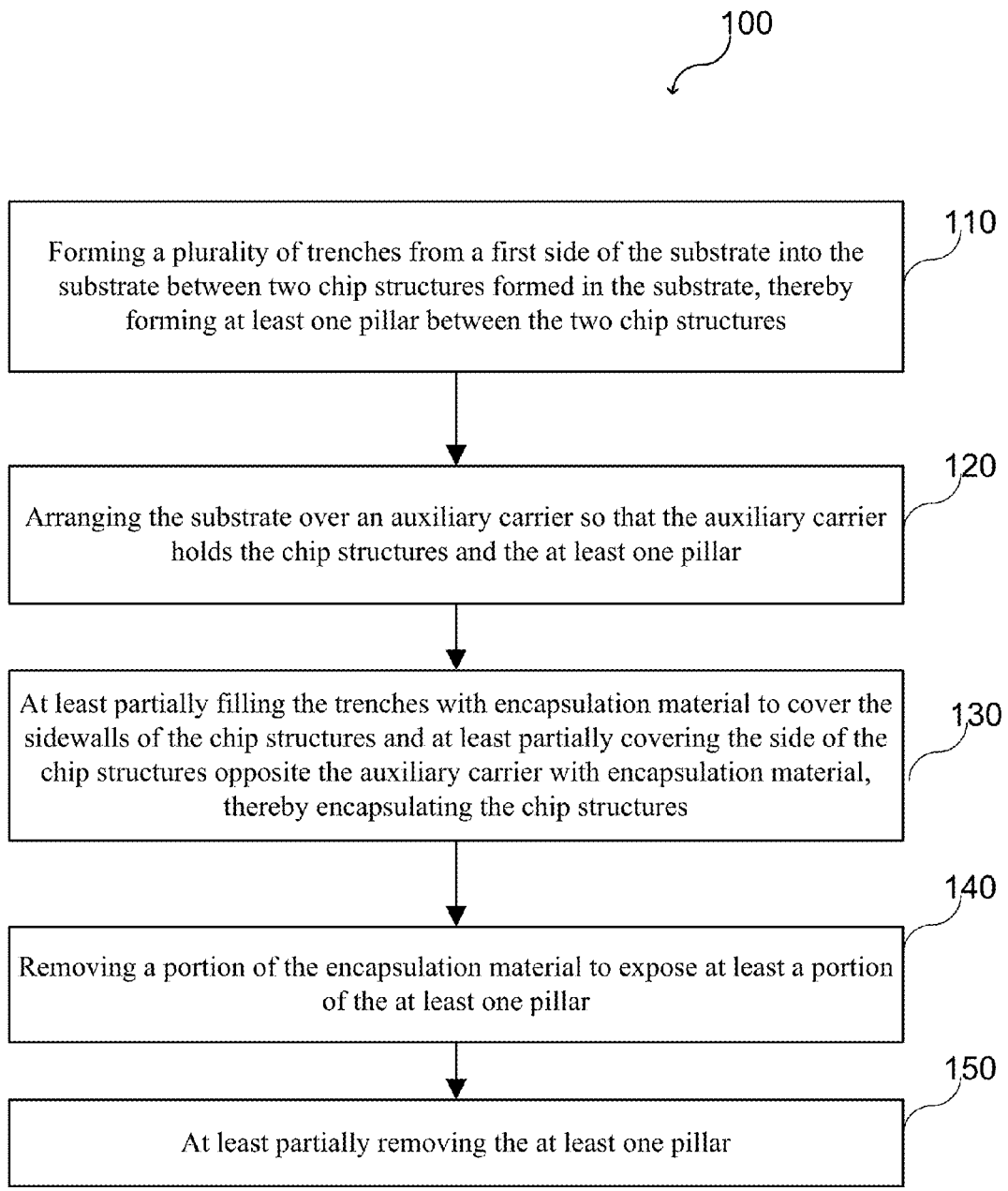

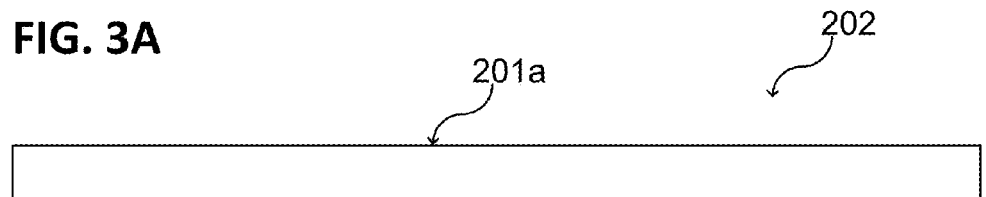
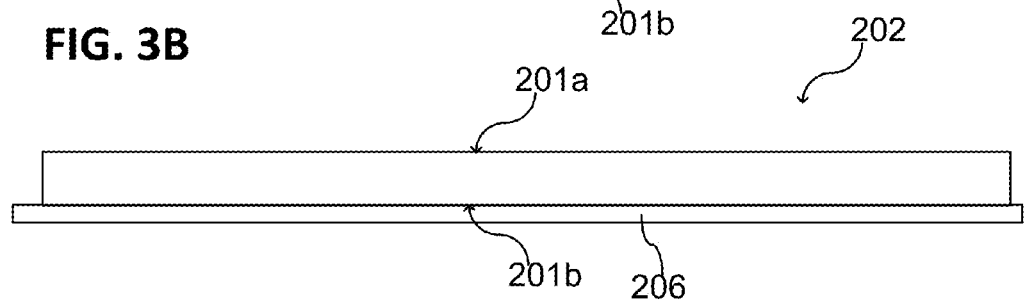
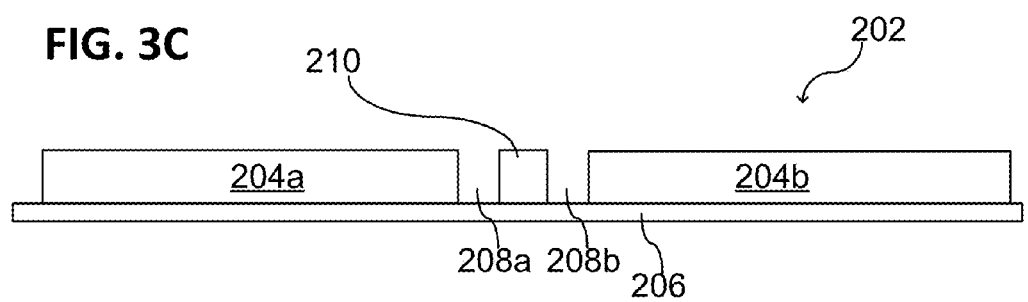
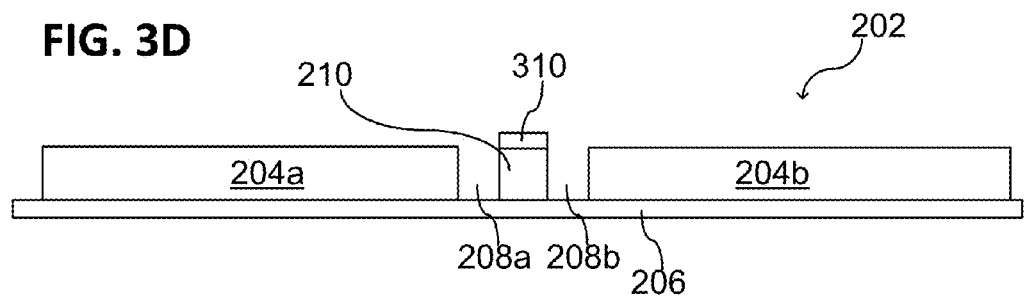
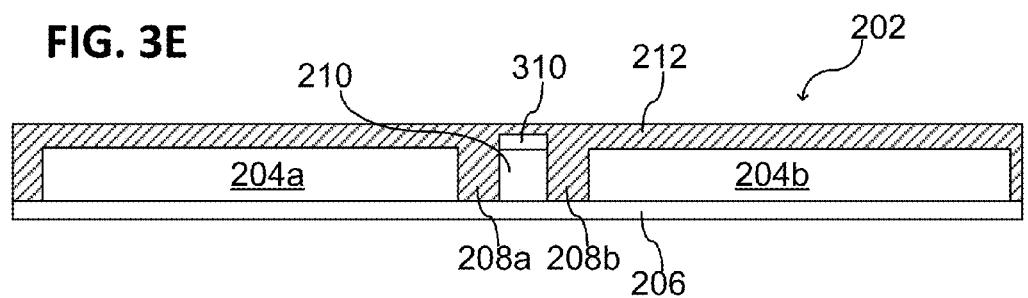

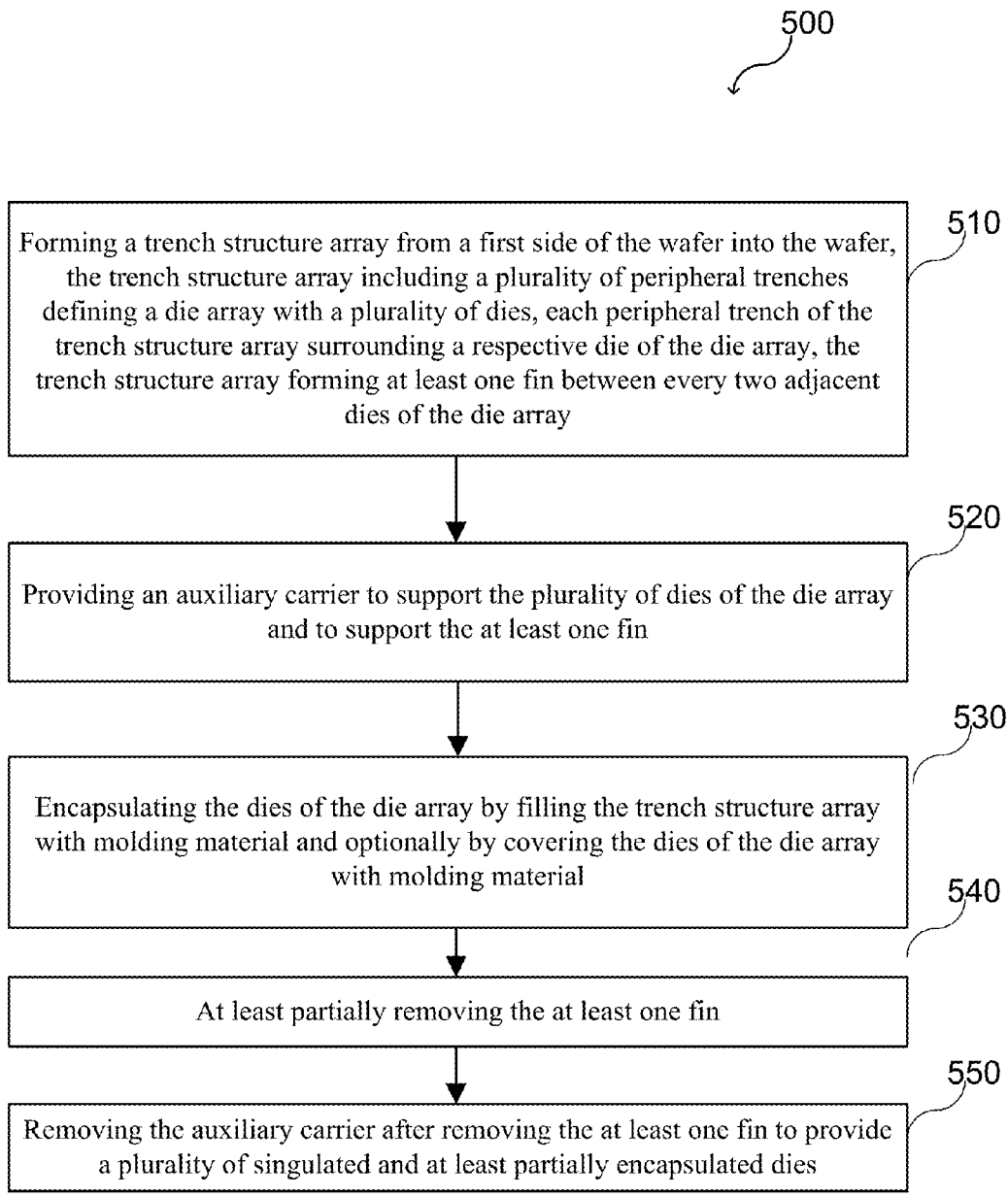

METHOD OF PROCESSING A SUBSTRATE AND A METHOD OF PROCESSING A WAFER

TECHNICAL FIELD

Various embodiments relate generally to a method of processing a substrate and to a method of processing a wafer.

BACKGROUND

In general, a plurality of integrated circuits (also called monolithic integrated circuits, ICs, chips, or microchips) may be processed in semiconductor technology on and/or in a wafer. The wafer (or the substrate or the carrier) may include a plurality of integrated circuit structures in corresponding regions of the wafer. The integrated circuit structures may be singulated after the semiconductor processing, typically by scribing and breaking, by mechanical sawing (e.g. using a dicing saw), and/or by laser cutting, to provide a plurality of dies or chips from the integrated circuit structures of the wafer. This process is typically called dicing or wafer dicing, wherein a plurality of dies (e.g. so called naked chips) or chips are provided from the wafer. Further, a final stage of semiconductor device fabrication may be the packaging (also called assembly, encapsulation, or seal) wherein a singulated integrated circuit (a die or a chip) may be encased, e.g. into a supporting material (molding material or encapsulation material) to prevent physical damage and/or corrosion of the singulated integrated circuit. The case that encases the die or the chip (the so called package or mold) may also support the electrical contacts to connect the die or the chip to a peripheral device, e.g. to a circuit board.

SUMMARY

According to various embodiments, a method of processing a substrate may include: forming a plurality of trenches into a substrate between two chip structures in the substrate, the trenches defining at least one pillar between the two chip structures and a sidewall on each of said two chip structures; disposing an auxiliary carrier on the substrate to hold the chip structures and the at least one pillar; at least partially filling the trenches with encapsulation material to cover the at least one pillar and the sidewalls, thereby at least partially encapsulating the chip structures; removing a portion of the encapsulation material to expose at least a portion of the at least one pillar; and at least partially removing the at least one pillar.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a schematic flow diagram of a method of processing a substrate according to various embodiments;

FIGS. 3A to 3E respectively show a substrate at various stages during processing according to various embodiments;

FIG. 5 shows a schematic flow diagram of a method of processing a substrate according to various embodiments;

DESCRIPTION

Figure 2A:
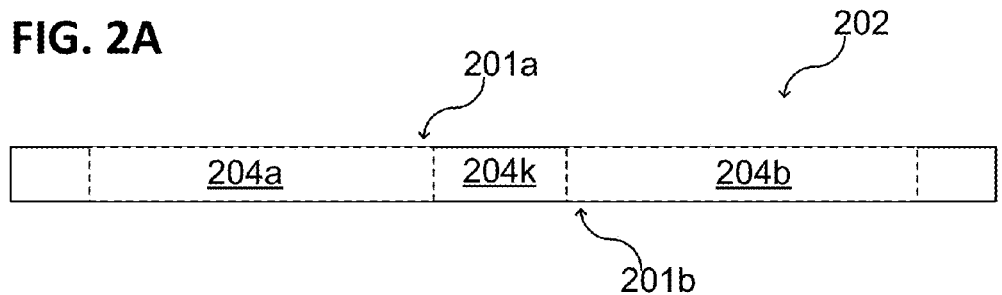
FIGS. 2A to 2F respectively show a substrate at various stages during processing according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (or of a substrate, a wafer, or a carrier) or "laterally" next to, may be used herein to mean an extension or a positional relationship along a surface of a substrate, a wafer, or a carrier. That means that a surface of a substrate (e.g. a surface of a carrier, or a surface of a wafer) may serve as reference, commonly referred to as the main processing surface of the substrate (or the main processing surface of the carrier or wafer). Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a substrate (e.g. perpendicular to the main processing surface of a substrate). The term "thickness" used with regards to a "thickness" of a layer may be used herein to mean the spatial extension of the layer perpendicular to the surface of the support (the material) on which the layer is deposited. If the surface of the support is parallel to the surface of the substrate (e.g. to the main processing surface) the "thickness" of the layer deposited on the support may be the same as the height of the layer. Further, a "vertical" structure may be referred to as a structure extending in a direction perpendicular to the lateral direction (e.g. perpendicular to the main processing surface of a substrate) and a "vertical" extension may be referred to as an extension along a direction perpendicular to the lateral direction (e.g. an extension perpendicular to the main processing surface of a substrate).

According to various embodiments, a substrate (e.g. a wafer, and another suitable carrier) may be made of semiconductor materials of various types, including silicon, germanium, Group III to V or other types, including polymers, for example, although in another embodiment, other suitable materials can also be used. In an embodiment, the wafer substrate is made of silicon (doped or undoped), in an alternative embodiment, the wafer substrate is a silicon on insulator (SOI) wafer. As an alternative, any other suitable semiconductor materials can be used for the wafer substrate, for example semiconductor compound material such as gallium arsenide (GaAs), indium phosphide (InP), but also any suitable ternary semiconductor compound material or quaternary semiconductor compound material such as indium gallium arsenide (InGaAs). According to various embodiments, the substrate may be a thin or an ultrathin substrate, e.g. with a thickness in the range from about several micrometers to about several tens of micrometers, e.g. in the range from about 5 µm to about 50 µm, e.g. with a thickness less than about 100 µm or less than about 50 µm.

According to various embodiments, the substrate (e.g. the wafer) being processed as described in the following may be readily processed, e.g. substrate may include a plurality of chip structures, die structures, or integrated circuit structures to be singulated from the substrate. According to various embodiments, the substrate may include a plurality of integrated circuit structures processed in CMOS (complementary metal oxide semiconductor) technology. According to various embodiments, a chip structure or an integrated circuit structure may include, for example, one or more diodes, one or more transistors, one or more power transistors, one or more capacitors, one or more thyristors, and the like. Further, a chip structure or an integrated circuit structure may be configured as a vertical structure with a current flow from the front side of the substrate to the back side of the substrate, and/or as a horizontal integrated circuit structure or horizontal electronic device with a lateral current flow within the substrate. According to various embodiments, a chip structure or an integrated circuit structure may include a power chip, an RF (radio frequency) chip, a transceiver chip, a receiver chip, a transmitter chip, a memory chip, an RFID (radio-frequency identification) chip, and/or any other suitable chip or chip structure being processed in semiconductor technology.

According to various embodiments, a method may be provided herein to form and/or separate a wafer level semiconductor package. The method provided herein may enable a significant improvement in costs, since a conventionally applied serial approach to separate a wafer level package is replaced by a parallel process, according to various embodiments. The conventionally applied approach for separating a wafer level package may include using blade dicing technology which is a serial process and leads depending on feed speed and number of dies to significant high production cost. According to various embodiments, separating a wafer level may be performed by utilizing an etch process, e.g. dry etching or wet etching as used in semiconductor technology. According to various embodiments, a method may be provided herein to form a wafer level semiconductor package and to singulate the individual dies or chips from the wafer level semiconductor package, wherein the singulated dies or chips may have a sidewall protection of molding material.

Wafer level packaging technology may include encapsulating (packaging) a plurality of integrated circuits (e.g. chips or dies) while the integrated circuits may still be handled as a single wafer and singulating the integrated circuits (e.g. the at least partially molded or at least partially encapsulated dies or chips) afterwards. In contrast, integrated circuit packaging may include first slicing the substrate into individual dies and subsequently packaging (packing) the individual dies into an encapsulation material.

Wafer level packaging may include extending the wafer fab processes to include device interconnection and device protection processes. Further, wafer level packaging may include attaching packaging layers and electrical connections (e.g. solder bumps) to the integrated circuits while the integrated circuits may be still handled as a wafer.

Conventionally applied wafer level packaging may include: applying a dicing tape on the wafer, separating the chips or dies of the wafer by blade dicing, encapsulating the separated chips or dies partially with encapsulation material while the chips or dies are mounted on the dicing tape, singulating the encapsulated chips or dies by blade dicing though the encapsulation material between the chips or dies, and removing the dicing tape. Since the conventionally applied methods for separating wafer level semiconductor packages may include a blade dicing of the encapsulation material (mold) between the chips or dies, these conventionally applied methods may be time consuming and therefore associated with high processing costs. Since the encapsulation material may not allow an anisotropic etching of the encapsulation material, blade dicing or other serial dicing processes may be the procedure of choice for the conventionally applied wafer level packaging technology.

According to various embodiments, a method of wafer level packaging of a plurality of dies or chips may be provided herein, wherein the encapsulated chips or dies on wafer level may be separated and/or singulated from each other by at least one parallel process, e.g. based on etching. Therefore, all dies or chips being packaged on wafer level may be separated and/or singulated at the same time (in parallel) which may allow a processing of a wafer or a wafer batch at the same time (in parallel).

FIG. 1 illustrates a schematic flow diagram of a method 100 of processing a substrate (in other words a carrier, e.g. a wafer), wherein the method 100 may include: in 110, forming a plurality of trenches from a first side of the substrate into the substrate between two chip structures (or integrated circuit structures) formed in the substrate, thereby forming at least one pillar (or fin) between the two chip structures; in 120, arranging the substrate over an auxiliary carrier (e.g. mounting the substrate on an auxiliary carrier, e.g. on a dicing tape) so that the auxiliary carrier holds the chip structures and the at least one pillar; in 130, at least partially filling the trenches with encapsulation material (e.g. with mold or molding material) to cover the sidewalls of the chip structures and at least partially covering the side of the chip structures opposite the auxiliary carrier with encapsulation material, thereby encapsulating the chip structures; in 140, removing a portion of the encapsulation material to expose at least a portion of the at least one pillar; and, in 150, at least partially removing the at least one pillar.

According to various embodiments, the at least one pillar may be or may include remaining substrate material between the adjacent dies or chips separated by the at least two trenches. Illustratively, the substrate may be diced into a plurality of dies (e.g. by etching), the plurality of dies being mounted on a dicing tape, wherein the dicing may be performed such that a fin or a fin structure is provided between respectively two adjacent dies on the dicing tape, and the dies and the respective fins may be encapsulated by forming (depositing) an encapsulation material over the exposed sides of the dies and fins which are free from the dicing tape or not connected to the dicing tape. In other words, a wafer level package is provided including a plurality of chips or dies being encapsulated and mounted on a dicing tape, wherein wafer material remains between the chips or dies as fins. By removing the fins and subsequently removing the dicing tape, the chips or dies of the wafer level package may be separated from each other and singulated. The fins, e.g. including substrate material, may be removed by etching (by a parallel process) to separate the plurality of dies or chips and further, a plurality of singulated encapsulated dies or singulated encapsulated chips may be provided by removing the dicing tape subsequently. Therefore, a blade dicing (a serial process) may not be necessary for separating and/or singulating the wafer level package into the plurality of singulated encapsulated dies or singulated encapsulated chips.

FIG. 2A illustrates a substrate 202 (in other words a carrier 202, e.g. a wafer 202) in a cross-sectional view during processing, e.g. during method 100 is carried out. The substrate 202 may include a first side 201a (or a first surface 201a) and a second side 201b (or second surface 201b) opposite the first side 201a (or first surface 201a). According to various embodiments, the first surface 201a may be a main processing surface of the substrate 202. Alternatively, the second surface 201b may be a main processing surface of the substrate 202. Further, the first surface 201a and the second surface 201b may be main processing surfaces of the substrate 202, e.g. for forming an electronically vertical device. The substrate 202 may have a thickness (e.g. perpendicular to the first side 201a and/or to the second side 201b) in the range from about 5 µm to about 100 µm, e.g. in the range from about 5 µm to about 50 µm, or the thickness of the substrate 202 may be less than about 100 µm.

The substrate 202 may include a first substrate region 204a and a second substrate region 204b arranged laterally next to each other. A first integrated circuit structure or a first chip structure may be formed or provided in and/or on the first substrate region 204a and a second integrated circuit structure or a second chip structure may be formed or provided in and/or on the second substrate region 204b. Further, the substrate may include a kerf region 204k between the first substrate region 204a and the second substrate region 204b for separating the first substrate region 204a from the second substrate region 204b.

According to various embodiments, the substrate 202 may include a plurality of substrate regions, e.g. more than two substrate regions 204a, 204b, e.g. more than 10, more than 20, more than 50, or more than 100 substrate regions. The substrate regions of the substrate may be arranged or may form an array, e.g. a square array if the substrate regions may have a quadratic shape seen from the top (cf. FIGS. 6A and 6B).

According to various embodiments, the substrate regions 204a, 204b and the kerf regions 204k may be taken into account during manufacturing the integrated circuit structures in and/or on the substrate to efficiently use the substrate for providing a plurality of dies or chips from the integrated circuit structures in the substrate regions 204a, 204b.

According to various embodiments, the substrate 204 may be a readily processed wafer including a plurality of integrated circuit structures laterally separated by one or more kerf regions 204k. The integrated circuit structures may include or may be connected to one or more electrical contacts (e.g. bumps, pins, pads, solder bumps, solder balls, and the like) for electrically contacting the integrated circuit structures. According to various embodiments, the one or more electrical contacts may be formed on the first side 201a and/or on the second side 201b of the substrate 202 or in other words respectively on the first side 201a and/or on the second side 201b of the integrated circuit structure.

According to various embodiments, FIG. 2A shows a substrate 202 at an initial processing stage, e.g. a substrate 202 to be diced including a plurality of integrated circuit structures 204a, 204b to be at least partially encapsulated and separated from each other.

Figure 2B:
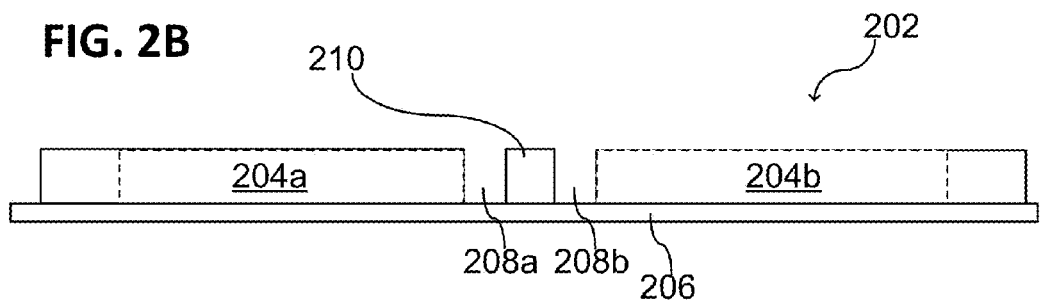

FIG. 2B illustrates the substrate 202 in a cross-sectional view during processing, e.g. at a processing stage after processes 110 and 120 of method 100 have been carried out, according to various embodiments. According to various embodiments, a trench structure with at least two trenches 208a, 208b may be formed into the substrate 202 between the first substrate region 204a and the second substrate region 204b (or in other words between the two adjacent integrated circuit structures 204a, 204b). Illustratively, the kerf region 204k of the substrate may be patterned, e.g. by standard semiconductor patterning including forming a mask over the substrate and partially etching the substrate material such that the first substrate region 204a is separated from the second substrate region 204b (the substrate material between the first substrate region 204a and the second substrate region 204b may be partially removed), wherein a pillar 210 or a fin 210 (a fin structure 210) may be provided (or may remain) between the first substrate region 204a and the second substrate region 204b.

At this processing stage, the first substrate region 204a may be or may provide a first chip or a first die and the second substrate region 204b may be or may provide a second chip or a second die. At this processing stage, as illustrated in FIG. 2B, according to various embodiments, the substrate 202 may include a plurality of chips or dies being spatially (laterally) separated from each other by the trench structure in the kerf region 204k. According to various embodiments, the substrate 202 may include more than 10, more than 20, more than 50, or more than 100 chips or dies being laterally separated from each other. According to various embodiments, the chips or dies formed from the substrate 202 may correspond to the substrate regions 204a, 204b.

According to various embodiments, the plurality of chips or dies may be mounted on an auxiliary carrier 206 (e.g. on a dicing tape 206) before being completely separated from each other via the at least two trenches 208a, 208b. The at least two trenches 208a, 208b may completely extend through the substrate from the first side 201a of the substrate 202 to the second side 201b of the substrate 202 opposite the first side 201a, wherein the chips or dies formed from the substrate 202 may be supported by the auxiliary carrier 206. The remaining substrate material 210 between the chips or dies formed from the substrate 202 may be supported by the auxiliary carrier 206 as well.

According to various embodiments, the trenches 208a, 208b may be formed into the substrate via etching, e.g. via an anisotropic etch process, e.g. via reactive ion etching. The auxiliary carrier 206 may cover the trenches 208a, 208b and support the pillar or fin 210 between the plurality of chips or dies provided from the substrate 202.

Illustratively, the first trench 208a may laterally surround the first substrate region 204a providing a first chip or die from the substrate 202, wherein the second trench 208b may laterally surround the second substrate region 204b providing a second chip or die from the substrate 202, wherein the trenches may be separated by the fin 210 between the first trench 208a and the second trench 208b. In other words, the trench structures may be formed in such a way that at least one fin 210 is provided between every chip or die provided from the substrate.

Figure 2C:
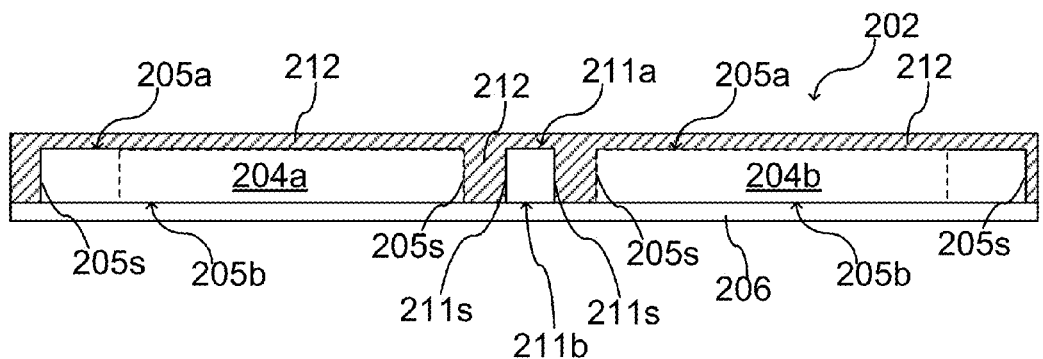

FIG. 2C illustrates the substrate 202 in a cross-sectional view during processing, e.g. at a processing stage after processes 110, 120 and 130 of method 100 have been carried out, according to various embodiments. According to various embodiments, the exposed sidewalls 205s and surfaces 205a of the chips or dies 204a, 204b provided from the substrate 202 and the exposed sidewalls 211s and surface 211 of the pillar or fin structure 210 between the dies 204a, 204b may be covered with encapsulation material 212. In other words, the trenches 208a, 208b may be filled with encapsulation material 212. Further, the surfaces 205a of the dies 204a, 204b (opposite the dicing tape 206) may be covered with encapsulation material 212.

Illustratively, the chips or dies provided on the auxiliary carrier 206 may be encapsulated. Thereby, a wafer level package may be provided, as illustrated in FIG. 2C, including a plurality of chips or dies 204a, 204b provided from the substrate 202. The encapsulation material 212 may include a polymer, e.g. an electrically insulating polymer or another electrically insulating compound, e.g. a resin, e.g. a thermosetting resin.

Figure 2D:
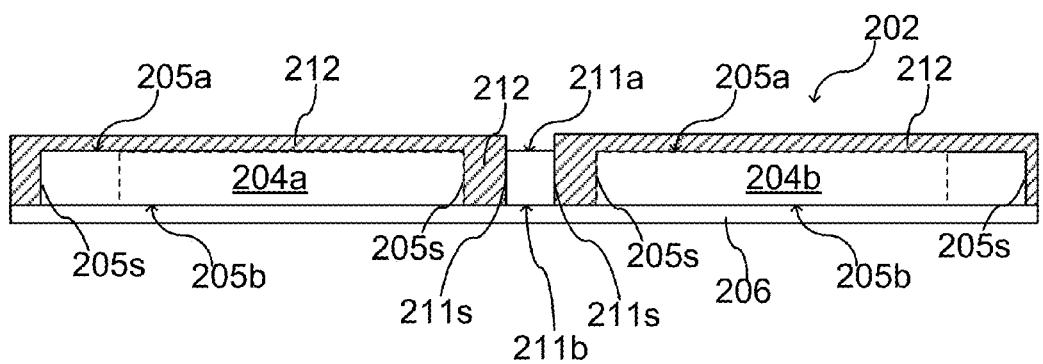

According to various embodiments, if the at least one pillar 210 or fin 210 between the chips or dies 204a, 204b is covered with encapsulation material 212, as for example illustrated in FIG. 2C, the encapsulation material 212 over the at least one pillar 210 or fin 210 may be at least partially removed to at least partially expose the at least one pillar 210 or fin 210 or to expose the surface 211a of the at least one pillar 210 or fin 210, as illustrated in FIG. 2D.

FIG. 2D illustrates the substrate 202 in a cross-sectional view during processing, e.g. at a processing stage after processes 110, 120, 130 and 140 of method 100 have been carried out, according to various embodiments, wherein a portion of the encapsulation material 212 has been removed to expose at least a portion of the at least one pillar 210 or fin 210. Therefore, the pillar 210 or fin 210 may be accessible such that an etch process can be applied to remove the pillar 210 or fin 210.

Figure 2E:
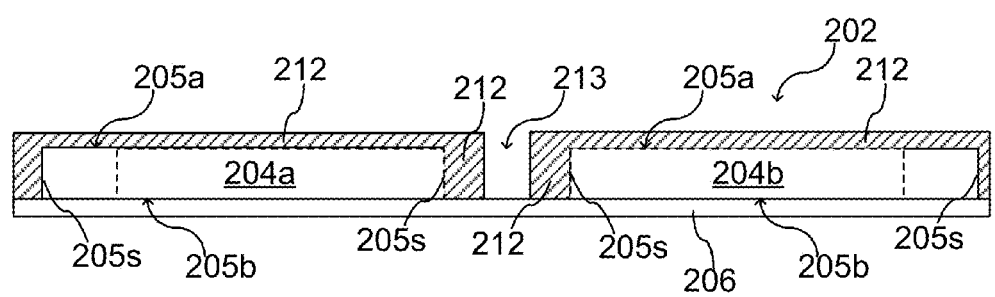

FIG. 2E illustrates the substrate 202 in a cross-sectional view during processing, e.g. at a processing stage after processes 110, 120, 130, 140 and 150 of method 100 have been carried out, according to various embodiments, wherein the at least one pillar 210 or fin 210 between the dies or chips 204a, 204b provided from the substrate has been removed.

According to various embodiments, after removing the at least one pillar 210 or fin 210 between the dies or chips 204a, 204b the sidewalls 205s of the dies or chips 204a, 204b may still be covered with encapsulation material 212. Further, the surfaces 205a of the dies or chips 204a, 204b may also be covered with encapsulation material 212.

Figure 2F:
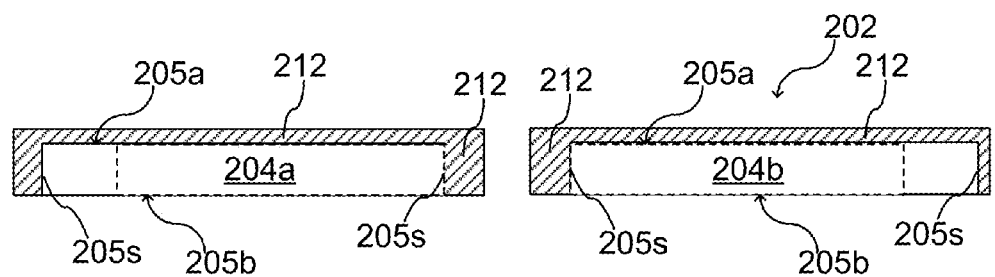

FIG. 2F illustrates the substrate 202 in a cross-sectional view during processing, e.g. after the at least one pillar 210 or fin 210 has been removed, according to various embodiments, wherein the auxiliary carrier 206 has been removed to provide a plurality of partially encapsulated and singulated chips or dies 204a, 204b.

According to various embodiments, removing the at least one pillar 210 or fin 210 may be used to separate the individual dies or chips from the wafer level package, the wafer level package including the encapsulated dies or chips 204a, 204b formed from the substrate 202.

Various modifications and/or configurations of the method of processing a substrate are described in the following, wherein the features and/or functionalities described with reference to FIG. 1 and FIGS. 2A to 2F may be included analogously. Further, the features and/or functionalities described in the following may be included in the method of processing a substrate or may be combined with the method of processing a substrate, as described before with reference to FIG. 1 and FIGS. 2A to 2F.

According to various embodiments, the method 100 of processing a substrate 202 may include a method for forming a wafer level package, e.g. by processes 110, 120 and 130, and a method for separating a wafer level package, e.g. by process 150. In the following, FIGS. 3A to 3E respectively illustrate the substrate 202 in a cross-sectional view during processing, e.g. during processes 110, 120 and/or 130 of method 100 are carried out or during forming a wafer level package.

FIG. 3A illustrates the substrate 202 in a cross-sectional view at an initial processing stage according to various embodiments. The substrate 202, e.g. a wafer, may include a front side 201a and a back side 201b. Without loss of generality, the auxiliary carrier 206 (e.g. a dicing tape) may be mounted on the back side 201b of the substrate 202 or the substrate 202 may be mounted on the auxiliary carrier 206 such that the back side 201b of the substrate 202 is in contact with the auxiliary carrier 206, as illustrated in FIG. 3B. The auxiliary carrier 206 may be mounted on the substrate 202 before the trenches 208a, 208b are (or the trench structure is) formed into the substrate 202 according to various embodiments.

As illustrated in FIG. 3C, the trenches 208a, 208b are (or the trench structure is) formed into the substrate, e.g. from the front side 201a, e.g. by masking and etching. Therefore, the front side 201a of the substrate 202 may be covered with a resist (or another mask material), the resist may be patterned by a lithographic process, and an anisotropic etch process may be applied to partially remove the substrate material to form the trenches 208a, 208b (or the trench structure).

Forming the trench structure into the substrate 202 may illustratively be regarded as dicing the substrate 202 into a plurality of dies. The plurality of dies (chips) and the fin structure 210 (the fin structure 210 may include one or more pillars or one or more fins) between respectively two adjacent dies 204a, 204b of the plurality of dies may be mounted on or may be supported by the dicing tape 206. The fin structure 210 between respectively two adjacent dies 204a, 204b may be used to separate the dies after the encapsulation process has been carried out. According to various embodiments, the trenches 208a, 208b (or the trench structure) may extend completely through the substrate 202 from the front side 201a to the back side 201b.

Optionally, according to various embodiments, the fin 210 between two adjacent dies 204a, 204b respectively may be covered with a material 310 (auxiliary material) before the dies 204a, 204b are encapsulated with molding material (encapsulation material), as illustrated in FIG. 3D, according to various embodiments. The material 310 covering the fin 210 may be a resist, e.g. a photoresist. The material 310 may be provided over the fin 210 by a layering process and a patterning process for patterning the resist layer formed by the layering process.

Subsequently, the dies and the fin structure 210 between the dies may be covered with encapsulation material 212 from the front side 201a to provide a wafer level package, as illustrated for example in FIG. 3E, according to various embodiments. Thereby, the material 310 over the fin structure 210 may be encapsulated as well (cf. FIGS. 8A and 8B).

Further, the encapsulation material 212 may be partially removed to at least partially expose the material 310 over the fin structure 210. Subsequently, the material 310 over the fin structure 210 may be removed to expose the fin structure 210 and to subsequently remove the fin structure 210.

According to various embodiments, a method for processing a wafer 202 may include: forming a wafer level package from a wafer 202, the wafer level package may include a plurality of dies (or chips) and a fin structure 210 (or a pillar structure 210) between respectively two adjacent dies 204a, 204b of the plurality of dies formed from the wafer 202, the plurality of dies (or chips) and the fin structure 210 being at least partially encapsulated with encapsulation material 212; and removing (e.g. exposing and etching) the fin structure 210 to separate the dies from the wafer level package.

According to various embodiments, a method for forming a wafer level package, as for example illustrated in FIGS. 3A to 3E, may include: separating a plurality of dies from a wafer 202 by forming a trench structure 208 into the wafer, the trench structure 208 including at least two trenches 208a, 208b provided between respectively two adjacent dies 204a, 204b of the plurality of dies, the at least two trenches 208a, 208b forming a fin structure 210 between respectively two adjacent dies 204a, 204b of the plurality of dies; and at least partially encapsulating the plurality of dies being separated from each other by the fin structure 210 by at least partially filling the fin structure 210 with encapsulation material 212. According to various embodiments, a method of singulating the wafer level package may include: removing the fin structure 210 from the wafer level package to singulate a plurality of at least partially encapsulated dies 204a, 204b from the wafer level package.

FIGS. 4A to 4E respectively illustrate the substrate 202 during processing in a cross-sectional view, e.g. during processes 110 and 120 of method 100 are carried out or e.g. during forming a wafer level package.

Figure 4A:
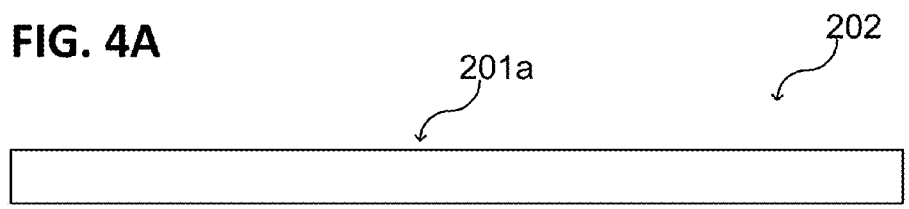
FIGS. 4A to 4E respectively show a substrate at various stages during processing according to various embodiments.

FIG. 4A illustrates the substrate 202 in a cross-sectional view at an initial processing stage according to various embodiments. The substrate 202, e.g. a readily processed substrate 202 including a plurality of integrated circuit structures, the integrated circuit structures being configured to be separated as dies from the substrate 202, may include a front side 201a and a back side 201b.

Figure 4B:
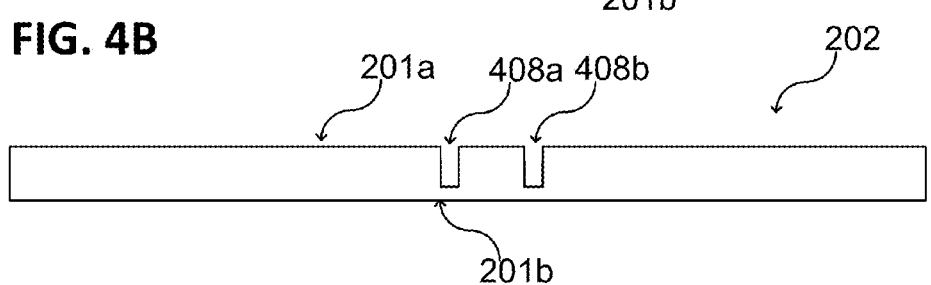

According to various embodiments, at least two blind trenches 408a, 408b may be formed into the substrate 202 from the first side 201a of the substrate 202, as illustrated in FIG. 4B. In other words, at least two trenches may be formed into the substrate 202 from the first side 201a of the substrate 202 which do not completely extend to the surface of the second side of the substrate 202 (thus, the blind trenches do not extend through the entire substrate 202), i.e. there remains a bottom of the blind trenches 408a, 408b made of the substrate material. Thus, a blind trench may be understood as being the trench analogy of a blind hole.

Figure 4C:
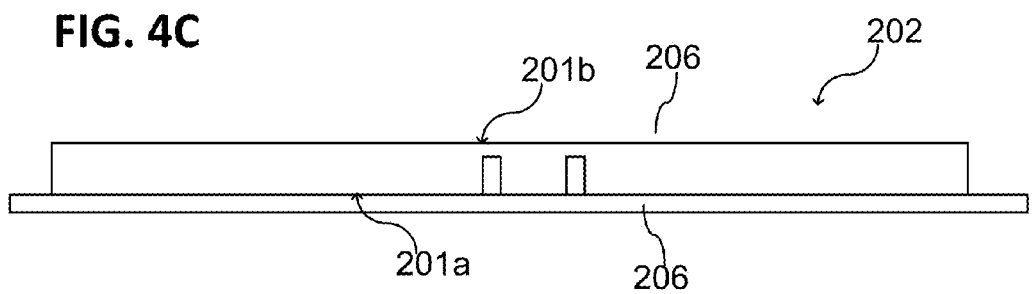

After forming the at least two blind trenches 408a, 408b (or after forming a blind trench structure including the at least two blind trenches 408a, 408b), the auxiliary carrier 206 (e.g. a dicing tape) may be mounted on the front side 201a of the substrate 202 or the substrate 202 may be mounted on the auxiliary carrier 206 such that the front side 201b of the substrate 202 is in contact with the auxiliary carrier 206, as illustrated in FIG. 4C. According to various embodiments, the auxiliary carrier 206 may cover the at least two blind trenches 408a, 408b.

Further, according to various embodiments, the substrate 202 may be thinned from the back side 201b to provide at least two trenches 208a, 208b (from the at least two blind trenches 408a, 408b), the at least two trenches 208a, 208b extending completely through the substrate 202, and to provide the fin structure 210 between the at least two trenches 208a, 208b. Illustratively, the substrate 202 may be separated into at least two dies 204a, 204b by the at least two trenches 208a, 208b after the substrate 202 has been thinned. The substrate 202 may be thinned by applying a grinding process for removing substrate material from the back side 201b of the substrate 202.

Illustratively, forming the blind trenches 408a, 408b and thinning the substrate 202 to provide the trenches 208a, 208b (extending completely through the substrate 202) may be regarded as a dicing of the substrate 202 into a plurality of dies 204a, 204b being separated by the trenches 208a, 208b and the fin structure 210 between the trenches 208a, 208b.

According to various embodiments, the auxiliary carrier 206 may be mounted on the substrate 202 after the at least two blind trenches 408a, 408b have been formed and before the trenches 208a, 208b are (or the trench structure is) formed in the substrate 202 by thinning of the substrate 202. According to various embodiments, if a thinning of the substrate 202 is applied, the initial substrate 202, e.g. as illustrated in FIG. 4A, may be thicker than about 100 μm, wherein the substrate 202 is thinned to a thickness of less than about 100 μm, e.g. by grinding.

Figure 4D:
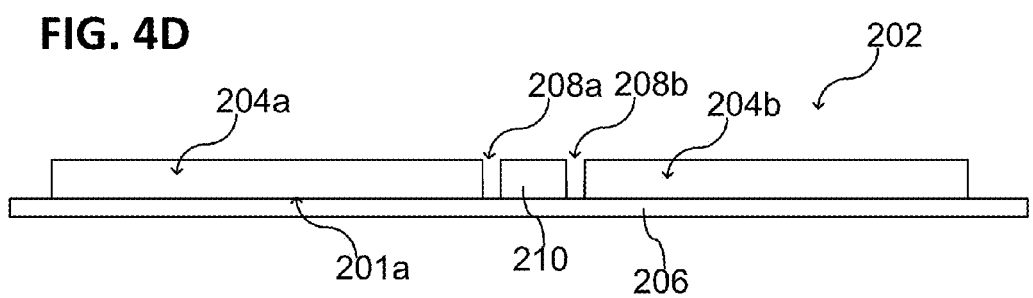
Figure 4E:
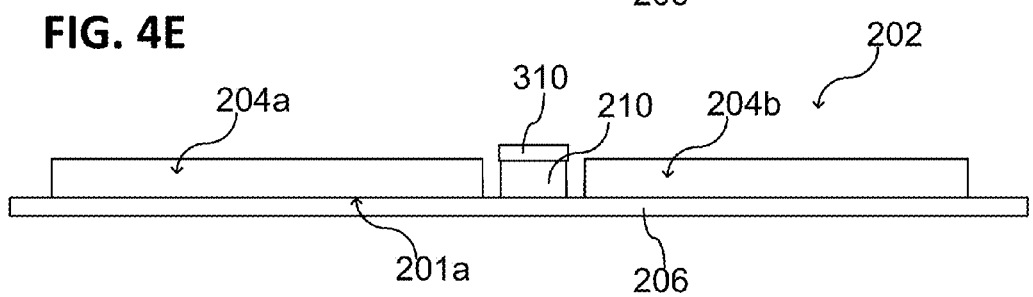

Optionally, according to various embodiments, the fin 210 between respectively two adjacent dies 204a, 204b may be covered with a material 310 (auxiliary material) before the dies 204a, 204b are encapsulated with molding material, as illustrated in FIG. 4E, according to various embodiments. The material 310 covering the fin 210 may be a resist, e.g. a photoresist. The material 310 may be provided over the fin 210 by a layering process and a patterning process for patterning the resist layer formed by the layering process.

Subsequently, the dies and the fin structure 210 between the dies provided from the substrate 202 may be covered with encapsulation material 212 from the back side 201b to provide a wafer level package (cf. FIGS. 8A and 8B) according to various embodiments. Thereby, the material 310 over the fin structure 210 may be encapsulated as well. Further, the encapsulation material 212 may be partially removed to at least partially expose the material 310 over the fin structure 210. Subsequently, the material 310 over the fin structure 210 may be removed to expose the fin structure 210 and to remove the fin structure 210 subsequently.

According to various embodiments, as illustrated in FIGS. 4C and 4D, substrate material may be removed from a second side (without loss of generality the back side 201b) of the substrate opposite the first side (without loss of generality the front side 201a) to open the blind trenches 408a, 408b after arranging the substrate 202 over an auxiliary carrier 206 to hold the chips or dies 204a, 204b.

According to various embodiments, the chips or dies 204a, 204b may include electrical contact structures at the front side and/or at the back side of the chips or dies 204a, 204b.

Figure 6A:
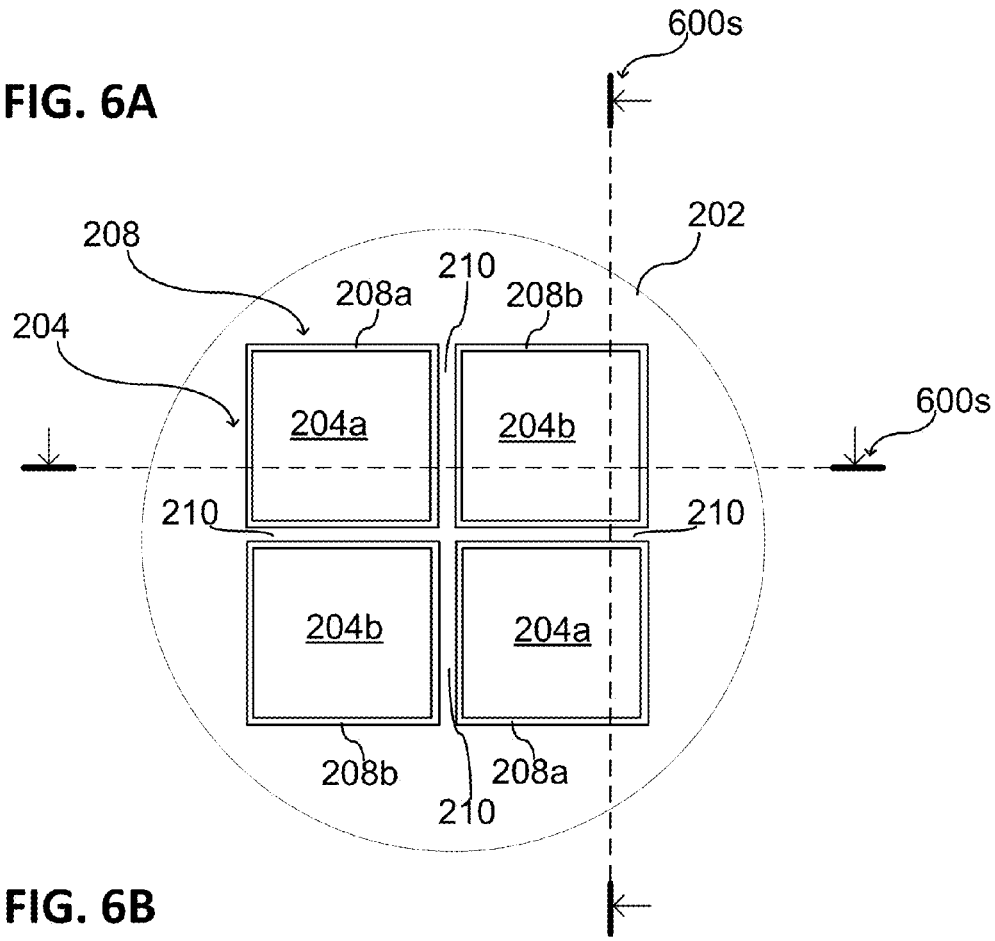
FIGS. 6A and 6B respectively show a substrate at various stages during processing according to various embodiments.
Figure 6B:
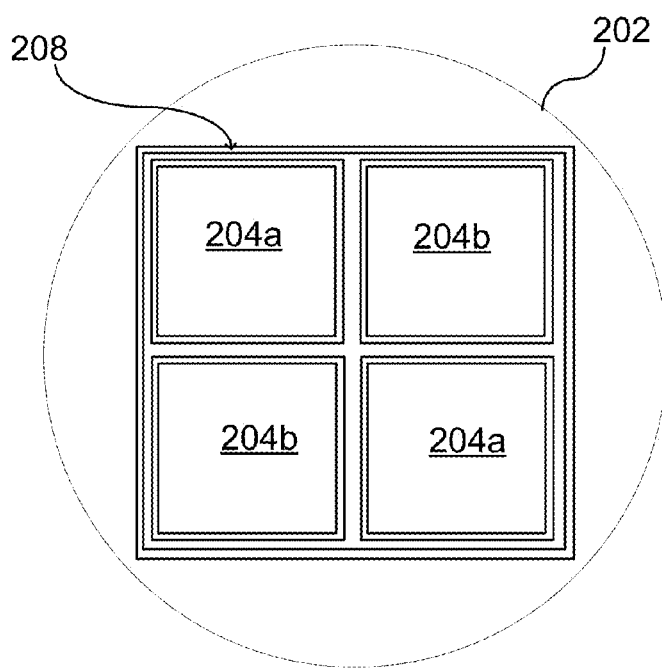

FIG. 5 shows a schematic flow diagram of a method 500 of processing a wafer 202 (e.g. a method of wafer level packaging), according to various embodiments, wherein the method 500 may include: in 510, forming a trench structure array 208 from a first side 201a of the wafer 202 into the wafer 202, the trench structure array 208 including a plurality of peripheral trenches 208a, 208b defining a die array 204 with a plurality of dies 204a, 204b, each peripheral trench 204a, 204b of the plurality of the trench structure array 208 surrounding a respective die 204a, 204b of the die array 204, the trench structure array 208 forming at least one fin 210 between every two adjacent dies 204a, 204b of the die array 204; in 520, providing an auxiliary carrier to support the plurality of dies 204a, 204b of the die array 204 and to support the fins 210; in 530, encapsulating the dies 204a, 204b of the die array 204 by filling the trench structure array 208 with molding material and optionally by covering the dies 204a, 204b of the die array 204 with molding material; in 540, at least partially removing the at least one fin 210; and, in 550, removing the auxiliary carrier after removing the at least one fin 210 to provide a plurality of singulated (and encapsulated) dies 204a, 204b (cf. FIG. 6A and FIG. 6B).

FIG. 6A and FIG. 6B respectively show a substrate 202 (e.g. a main processing surface 201a, 201b of a wafer 202) in a top view during processing, analogous to the above-described. FIG. 6A shows exemplarily two cross section lines 600s corresponding, for example, to one or more of the cross sections of the substrate 202 illustrated herein according to various embodiments.

According to various embodiments, a trench structure 208 including a plurality of trenches 208a, 208b may be formed into the substrate 202 from the main processing surface. The trench structure 208 defining a plurality of substrate regions 204a, 204b (integrated circuit regions or die regions) in the substrate 202 to be separated to individual dies or chips after forming a wafer level package from the substrate 202, as described before. Each substrate region 204a, 204b may be laterally surrounded by a corresponding peripheral trench 208a, 208b, wherein the peripheral trenches 208a, 208b are provided such that a fin structure 210 (with at least one fin) remains from the substrate material between the substrate regions 204a, 204b.

According to various embodiments, the substrate regions 204a, 204b with the corresponding trenches 208a, 208b may be surrounded by a laterally encircling trench defining the edges of the arrangement of substrate regions 204a, 204b, as illustrated in FIG. 6B.

According to various embodiments, the trench structure 208 separating the substrate 202 into a die array 204, the die array 204 including a plurality of dies 204a, 204b. After encapsulation, the die array 204 may provide a wafer level package which may be singulated by removing the fin structure 210 between the dies 204a, 204b of the die array 204. As illustrated in FIGS. 6A and 6B, a first die 204a may be provided (laterally) adjacent to a second die 204b in the die array 204.

Figure 7:
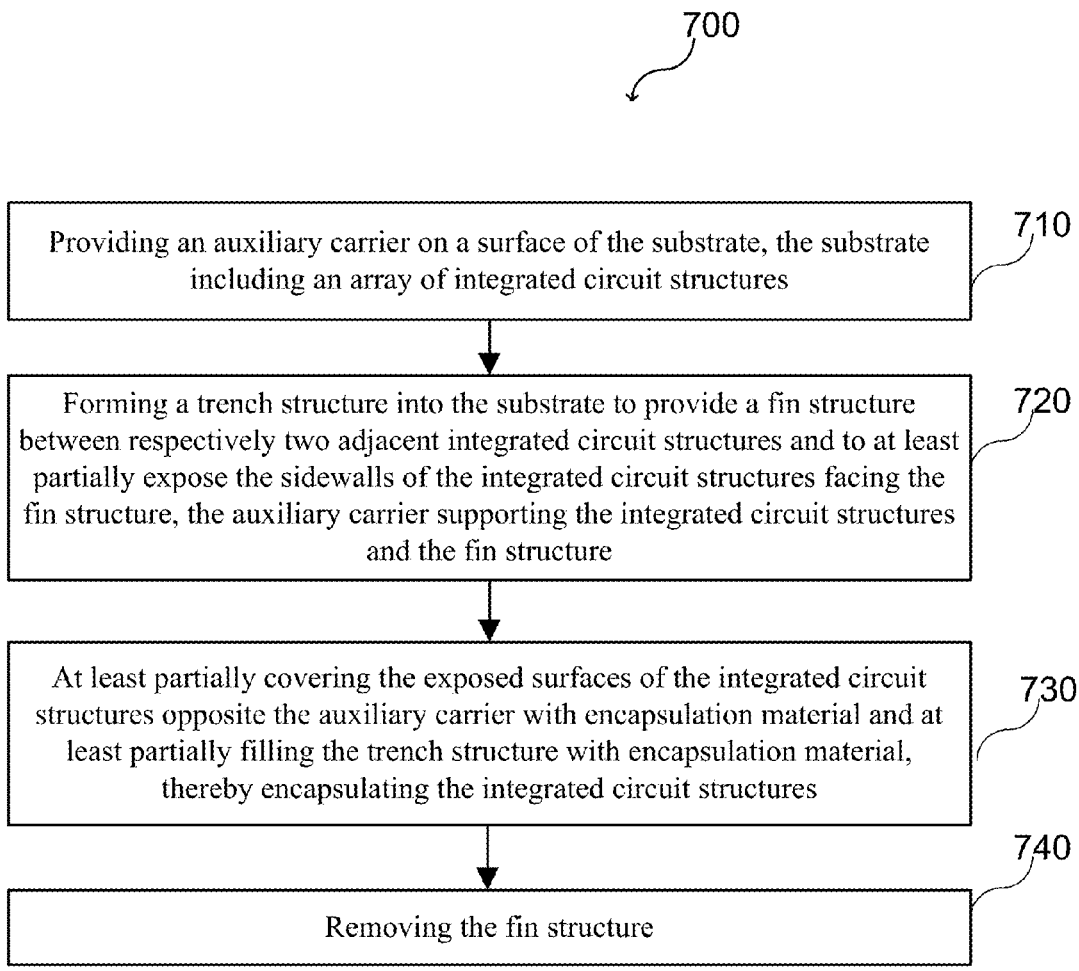
FIG. 7 shows a schematic flow diagram of a method of processing a substrate according to various embodiments.

FIG. 7 shows a schematic flow diagram of a method 700 of processing a substrate 202 (e.g. a wafer), according to various embodiments, wherein the method 700 may include: in 710, providing an auxiliary carrier 206 on a surface of the substrate 202, the substrate 202 including an array 204 of integrated circuit structures 204a, 204b; in 720, forming a trench structure 208 into the substrate 2020 to provide a fin structure 210 between every two adjacent integrated circuit structures 204a, 204b and to at least partially expose the sidewalls of the integrated circuit structures 204a, 204b facing the fin structure 210, the auxiliary carrier 206 supporting the integrated circuit structures 204a, 204b and the fin structure 210; in 730, at least partially covering the exposed surfaces of the integrated circuit structures 204a, 204b opposite the auxiliary carrier 206 with encapsulation material 212 and at least partially filling the trench structure 208 with encapsulation material 212, thereby encapsulating the integrated circuit structures 204a, 204b; and, in 740, removing the fin structure 210. According to various embodiments, a wafer level package may be formed by performing processes 710, 720, and 730 and the wafer level package may be separated (e.g. by performing process 740) and/or singulated (e.g. by removing the auxiliary carrier 206) into a plurality of at least partially encapsulated integrated circuit structures 204a, 204b.

Figure 8A:
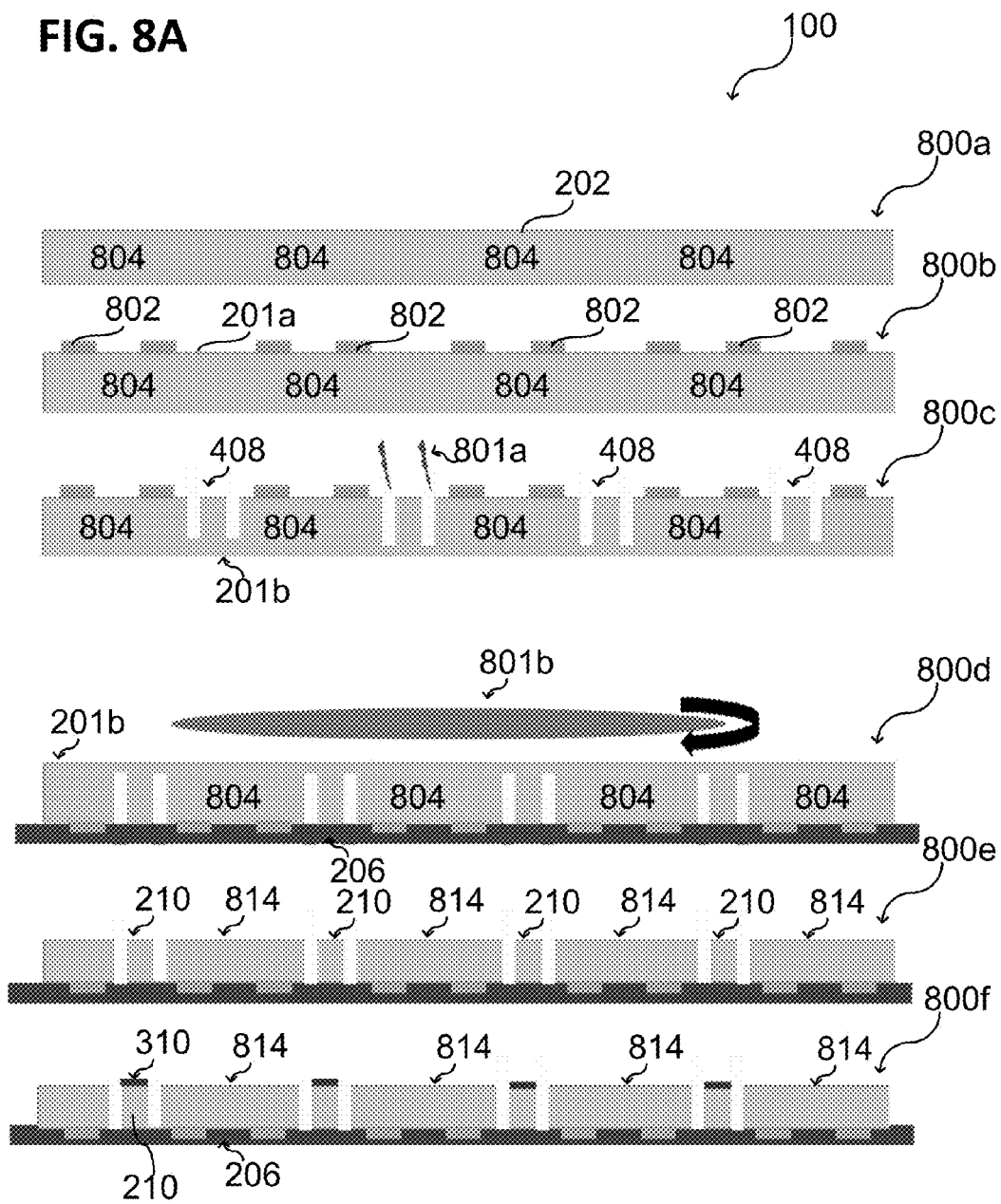
FIGS. 8A and 8B respectively show a substrate at various stages during processing according to various embodiments.
Figure 8B:
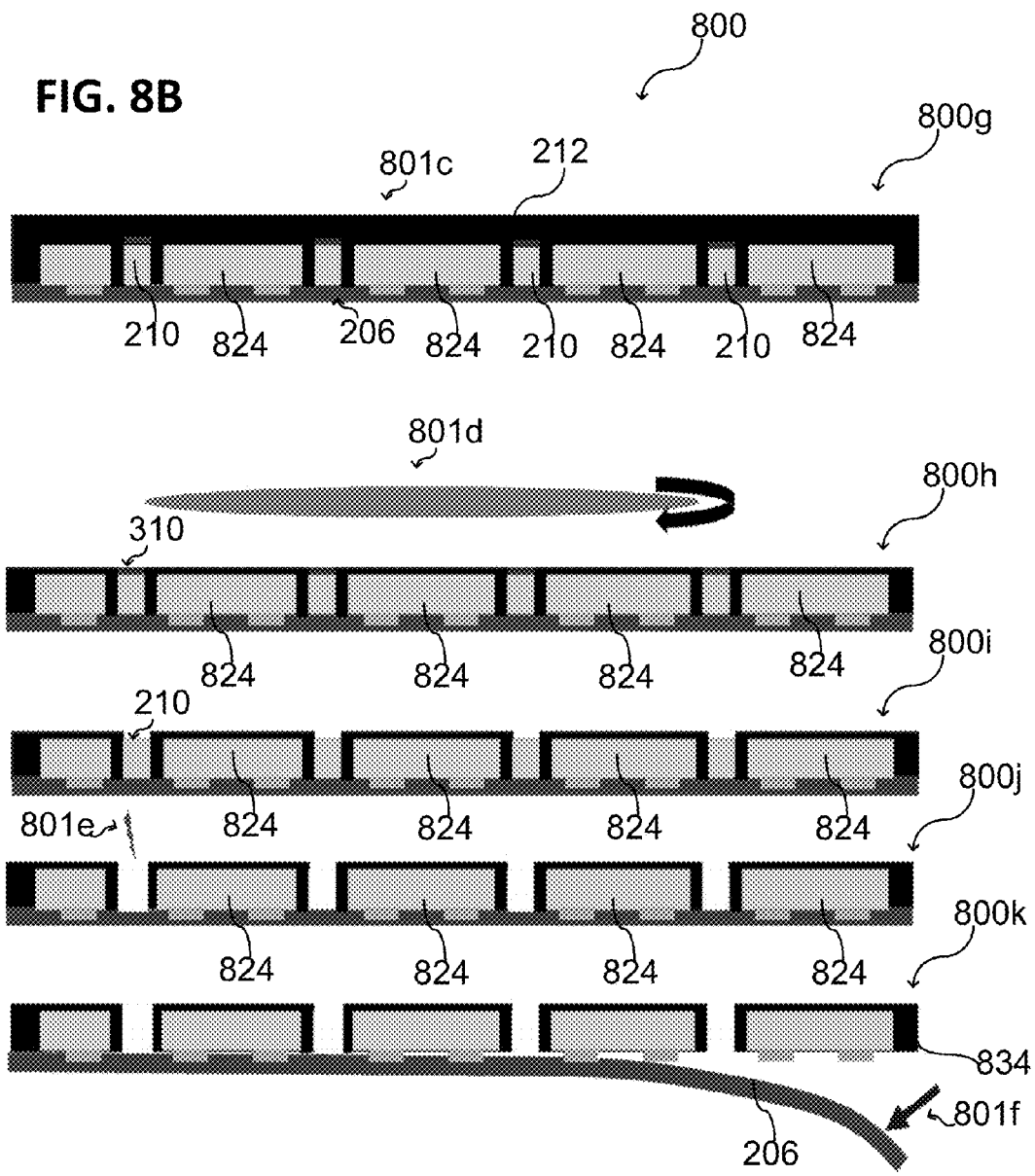

FIG. 8A and FIG. 8B respectively illustrate the substrate 202 during processing in a cross-sectional view, e.g. during method 100 is carried out or e.g. during forming a wafer level package including a plurality of partially encapsulated dies or chips and singulating the partially encapsulated dies or chips from the wafer level package, analogous to the above-described.

At an initial processing stage 800a, according to various embodiments, the substrate 202 may include a plurality of integrated circuit structures 804 (e.g. chip structure or die structures or substrate regions) to be partially encapsulated and separated from each other according to various embodiments. At a further processing stage 800b, according to various embodiments, a contact structure 802 may be provided over a first processing surface 201a of the substrate, the contact structure 802 may enable the electrical contacting of each of the integrated circuit structures 804.

At a further processing stage 800c, according to various embodiments, a blind trench structure 408 including a plurality of blind trenches may be formed (e.g. etched 801a) into the substrate 202 from the first processing surface 201a, the blind trench structure 408 may be formed between the integrated circuit structures 804 to partially separate the integrated circuit structures 804 from each other and to provide a part of a fin structure 210 between the integrated circuit structures 804.

At a further processing stage 800d, according to various embodiments, a dicing tape 206 may be mounted on the first processing surface 201a of the substrate 202 and the substrate 202 may be thinned (e.g. by grinding 801b or by chemical mechanical polishing 801b) from the second processing surface 201b opposite the first processing surface 201a. Alternatively, the substrate 202 may be mounted accordingly on the dicing tape 206.

After thinning 801b the substrate 202, e.g. at a further processing stage 800e, a plurality of separated integrated circuit structures 814 (e.g. a plurality of separated dies 814 or a plurality of separated chips 814) is provided, wherein a fin structure is arranged respectively between the separated integrated circuit structures 814, wherein the fin structure 210 is spaced apart from the separated integrated circuit structures 814.

At a further processing stage 800f, according to various embodiments, the fin structure 210 between the separated integrated circuit structures 814 may be covered with a resist 310 (or another suitable auxiliary material) to increase the extent of the fin structure 210. This may allow an easier access to the fin structure 210 after the encapsulation of the separated integrated circuit structures 814 and the fin structure 210.

According to various embodiments, the separated integrated circuit structures 814 may be free of the auxiliary material 310 (the resist or the polymer). The auxiliary material 310 may be formed on the fin structure 210 from the second processing surface 201b.

Optionally, according to various embodiments, further contacts or further contact structures may be formed from the second processing surface 201b to electrically contact the separated integrated circuit structures 814 (not illustrated).

At a further processing stage 800g, according to various embodiments, the separated integrated circuit structures 814 and the fin structure 210 may be molded 801c or encapsulated 801c from the second processing surface 201b. According to various embodiments, the molding material 212 or the encapsulation material 212 may cover the exposed sides and surfaces of the separated integrated circuit structures 814 and the fin structure 210 partially or completely. In other words, the exposed sides and surfaces of the separated integrated circuit structures 814 and the fin structure 210 being mounted on the dicing tape 206 may be encapsulated, thereby providing a wafer level package including a plurality encapsulated integrated circuit structures 824 from the separated integrated circuit structures 814. The molding material 212 or the encapsulation material 212 may fill the trench structure 208 partially or completely. According to various embodiments, the molding material 212 or the encapsulation material 212 may protect the sidewalls of the encapsulated integrated circuit structures 824.

As illustrated in FIG. 8B, the auxiliary material 310 may protrude from the fin structure 210 over the upper surface provided by the encapsulated integrated circuit structures 824. At a further processing stage 800h, according to various embodiments, the molding material 212 or the encapsulation material 212 may be partially removed (e.g. by grinding 801d or polishing 801d). According to various embodiments, the auxiliary material 310 may be exposed, wherein the encapsulated integrated circuit structures 824 remain covered with the encapsulation material 212. Subsequently, at a further processing stage 800i, the exposed auxiliary material 310 may be removed, e.g. by etching or by solving the auxiliary material 310 (e.g. a resist) in a solvent. According to various embodiments, the auxiliary material 310 may be stripped off from the fin structure 210, wherein the encapsulated integrated circuit structures 824 remain covered with the encapsulation material 212.

At a further processing stage 800j, according to various embodiments, the fin structure 210 may be removed, e.g. by etching 801e. The fin structure 210 may include substrate material, e.g. silicon. According to various embodiments, the fin structure 210 may be etched selectively such that the encapsulated integrated circuit structures 824 (or at least the sidewalls of the encapsulated integrated circuit structures 824) remain covered with the encapsulation material 212.

According to various embodiments, the encapsulated integrated circuit structures 824 may be separated from each other by removing the fin structure 210 from between encapsulated integrated circuit structures 824. Illustratively, the encapsulated integrated circuit structures 824 of the wafer level package may be separated from each other by removing the fin structure 210.

At a further (e.g. final) processing stage 800k, according to various embodiments, the auxiliary carrier 206 may be removed, e.g. stripped off 801f from the encapsulated integrated circuit structures 824. According to various embodiments, the separated encapsulated integrated circuit structures 824 may be released from the auxiliary carrier 206 (dicing tape), thereby providing a plurality of singulated encapsulated integrated circuit structures 834.

According to various embodiments, the first processing surface 201a of the substrate 202 may include a passivation or may be covered with a passivation layer such that the surface of the singulated encapsulated integrated circuit structures 834 being free from the encapsulation material 212 may be protected by the passivation or the passivation layer.

According to various embodiments, the surface of the singulated encapsulated integrated circuit structures 834 (singulated encapsulated dies 834 or singulated encapsulated chips 834) being covered with the encapsulation material 212 can be opened locally if it is required for electrical contacting of the singulated encapsulated integrated circuit structures 834.

According to various embodiments, conventional cost efficient etching technology may be utilized for device separation (chip separation or die separation).

Figure 9:
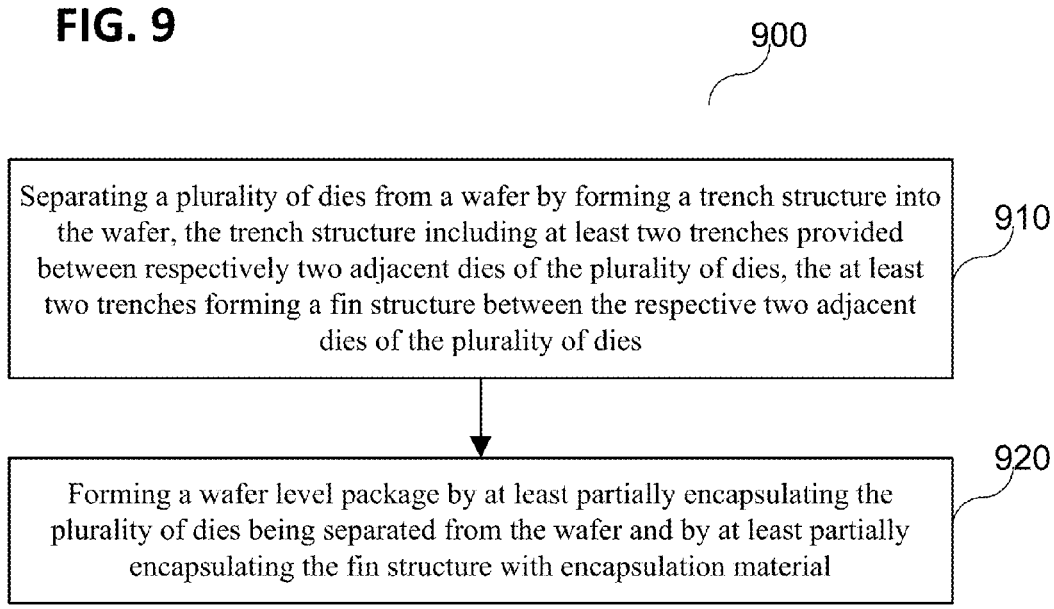
FIG. 9 shows a schematic flow diagram of a method of processing a wafer according to various embodiments.

FIG. 9 illustrates a schematic flow diagram of a method 900 of processing a wafer 202, wherein the method 900 may include: in 910, separating a plurality of dies 204 from the wafer 202 by forming a trench structure 208 into the wafer 202, the trench structure 208 including at least two trenches 208a, 208b provided between respectively two adjacent dies 204a, 204b of the plurality of dies 204, the at least two trenches 208a, 208b forming a fin structure 210 between the respective two adjacent dies 204a, 204b of the plurality of dies 204; and, in 920, forming a wafer level package by at least partially encapsulating the plurality of dies 204 being separated from the wafer 202 and by at least partially encapsulating the fin structure 210 with encapsulation material.

According to various embodiments, method 900 of processing a wafer 202 may further include: removing the fin structure 210 from the wafer level package to singulate a plurality of at least partially encapsulated dies from the wafer level package.

According to various embodiments, a method for encapsulating and singulating a plurality of chips or dies on wafer level may be provided herein, wherein the processing may allow to replace conventionally involved serial processing (e.g. blade dicing) by parallel processing (e.g. etching, e.g. wet etching).

The singulated encapsulated devices (e.g. small diodes or single transistors) may have a side protection provided by the encapsulation material covering the sidewalls of the singulated encapsulated devices. Without loss of generality, the encapsulation may be provided over the front side 201a of the device or over the back side 201b of the device. According to various embodiments, for encapsulating chips being thinner than 50 μm, etching blind trenches (not completely extending through the wafer after the etching) may allow a secure handling, cf. for example FIGS. 4A to 4E and FIGS. 8A and 8B.

According to various embodiments, the sidewalls 205s of the singulated encapsulated devices (chips or dies, e.g. transistors or diodes) may remain covered with encapsulation material 212 after the singulation of the wafer level package; cf. for example FIGS. 2E and 2F.

The encapsulation material 212 may provide the desired electrical contacting for the singulated encapsulated devices or the encapsulation material 212 may be patterned to provide the desired electrical contacting for the singulated encapsulated devices, e.g. for semiconductor power devices.

According to various embodiments, a method of processing a substrate may include: forming a plurality of trenches from a first side of the substrate into the substrate between two chip structures formed in the substrate, thereby forming at least one pillar between the two chip structures; arranging the substrate over an auxiliary carrier so that the auxiliary carrier holds the chip structures and the at least one pillar; at least partially filling the trenches with encapsulation material to cover the sidewalls of the chip structures and at least partially covering the side of the chip structures opposite the auxiliary carrier with encapsulation material, thereby encapsulating the chip structures; removing a portion of the encapsulation material to expose at least a portion of the at least one pillar; and at least partially removing the at least one pillar.

According to various embodiments, the trenches of the plurality of trenches may have a width greater than about 1 μm. According to various embodiments, the distance between the at least two trenches separating the chip structures may be greater than about 1 μm. In other words, the width of the pillar or of the fin separating the chip structures may be greater than about 1 μm.

According to various embodiments, the auxiliary carrier may cover the trenches.

According to various embodiments, the at least one pillar may be removed completely.

According to various embodiments, the trenches may be blind trenches.

According to various embodiments, the method of processing a substrate may further include: removing substrate material from a second side of the substrate opposite the first side to open the blind trenches after the substrate is arranged over an auxiliary carrier to hold the chip structures.

According to various embodiments, the trenches may extend (completely) through the substrate from the first side of the substrate to a second side of the substrate opposite the first side.

According to various embodiments, the method of processing a substrate may further include: forming material (auxiliary material) on the at least one pillar before encapsulating the chip structures, wherein removing the portion of the encapsulation material to expose at least a portion of the at least one pillar may include removing the portion of the encapsulation material to at least partially expose the material formed on the at least one pillar.

According to various embodiments, the material may include a resist.

According to various embodiments, the resist may include a photosensitive resist.

According to various embodiments, the method of processing a substrate may further include: removing the material to at least partially expose the surface of the at least one pillar.

According to various embodiments, the method of processing a substrate may further include: removing the auxiliary carrier to provide the plurality of singulated chips.

According to various embodiments, the chip structures may include a chip structure selected from a group of chip structures consisting of: at least one diode structure; at least one transistor structure; at least one power transistor structure.

According to various embodiments, removing a portion of the encapsulation material may include grinding the encapsulation material.

According to various embodiments, at least partially removing the at least one pillar may include an etch process.

According to various embodiments, forming a plurality of trenches may include an etch process.

According to various embodiments, a method of processing a wafer may include: separating a plurality of dies from a wafer by forming a trench structure into the wafer, the trench structure including at least two trenches provided between respectively two adjacent dies of the plurality of dies, the at least two trenches forming a fin structure between the respective two adjacent dies of the plurality of dies; and forming a wafer level package by at least partially encapsulating the plurality of dies being separated from the wafer and by at least partially encapsulating the fin structure with encapsulation material.

According to various embodiments, the method of processing a wafer may further include: removing the fin structure from the wafer level package to singulate a plurality of at least partially encapsulated dies from the wafer level package.

According to various embodiments, removing the fin structure may include exposing the fin structure at least partially and etching the fin structure.

According to various embodiments, the method of processing a wafer may further include: providing an auxiliary carrier to support the plurality of separated dies and to support the fin structure.

According to various embodiments, a method of processing a substrate may include: providing an auxiliary carrier on a surface of a substrate, the substrate including a plurality of integrated circuit structures; forming a trench structure into the substrate to provide at least one fin between every two adjacent integrated circuit structures and to at least partially expose the sidewalls of the integrated circuit structures facing the fins, the auxiliary carrier supporting the integrated circuit structures and the fins; at least partially covering the exposed surfaces of the integrated circuit structures opposite the auxiliary carrier with encapsulation material and at least partially filling the trench structure with encapsulation material, thereby encapsulating the integrated circuit structures; and removing the fins. Further, at least partially filling the trenches further includes covering at least a portion of a side of the chip structure opposite the auxiliary carrier with encapsulation material.

According to various embodiments, a method of processing a substrate may include: forming a plurality of trenches into a substrate between two chip structures in the substrate, the trenches defining at least one pillar between the two chip structures and a sidewall on each of said two chip structures; disposing an auxiliary carrier on the substrate to hold the chip structures and the at least one pillar; at least partially filling the trenches with encapsulation material to cover the at least one pillar and the sidewalls, thereby at least partially encapsulating the chip structures; removing a portion of the encapsulation material to expose at least a portion of the at least one pillar; and at least partially removing the at least one pillar.

According to various embodiments, a method of processing a substrate may include: providing an auxiliary carrier on a substrate, the substrate including a plurality of integrated circuit structures; forming a trench structure into the substrate to separate said integrated circuit structures and to provide a fin structure between every two adjacent integrated circuit structures of said integrated circuit structures; the auxiliary carrier supporting the plurality of integrated circuit structures and the fin structure; filling at least the trench structure with encapsulation material, thereby at least partially encapsulating the integrated circuit structures; and removing the fin structure to separate the at least partially encapsulated integrated circuit structures.

According to various embodiments, a method of processing a wafer substrate may include: separating a plurality of dies from a wafer by forming a trench structure into the wafer, the trench structure including at least two trenches provided between two adjacent dies of the plurality of dies, respectively; the at least two trenches forming a fin structure between the respective two adjacent dies of the plurality of dies; and forming a wafer level package by at least partially encapsulating the plurality of dies separated from the wafer and by at least partially encapsulating the fin structure with encapsulation material.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of processing a substrate, the method comprising:
    forming a plurality of trenches into a substrate between two chip structures in the substrate, the trenches defining at least one pillar between the two chip structures and a sidewall on each of said two chip structures;
    disposing an auxiliary carrier on the substrate to hold the chip structures and the at least one pillar;
    at least partially filling the trenches with encapsulation material to cover the at least one pillar and the sidewalls, thereby at least partially encapsulating the chip structures;
    removing a portion of the encapsulation material to expose at least a portion of the at least one pillar; and
    at least partially removing the at least one pillar.

2. The method of claim 1,
    wherein at least partially filling the trenches further comprises covering at least a portion of a side of the chip structure opposite the auxiliary carrier with encapsulation material.

3. The method of claim 1, further comprising:
    completely removing the at least one pillar.

4. The method of claim 1,
    wherein the trenches are blind trenches formed from a first side of the substrate into the substrate.

5. The method of claim 4, further comprising:
    removing substrate material from a second side of the substrate opposite the first side to open the blind trenches.

6. The method of claim 1,
    wherein the trenches extend completely through the substrate from a first side of the substrate to a second side of the substrate opposite the first side.

7. The method of claim 1, further comprising:
    forming material on the at least one pillar before at least partially encapsulating the chip structures, wherein removing the portion of the encapsulation material to expose at least a portion of the at least one pillar comprises removing the portion of the encapsulation material to at least partially expose the material formed on the at least one pillar.

8. The method of claim 7,
    wherein the material comprises a resist.

9. The method of claim 8,
    wherein the resist comprises a photosensitive resist.

10. The method of claim 7, further comprising:
    removing the material to at least partially expose the surface of the at least one pillar.

11. The method of claim 1, further comprising:
    removing the auxiliary carrier to singulate the at least partially encapsulated chip structures.

12. The method of claim 1,
    wherein the chip structures comprise at least one chip structure selected from a group of chip structures consisting of:
    at least one diode structure;
    at least one transistor structure;
    at least one power transistor structure.

13. The method of claim 1,
    wherein removing a portion of the encapsulation material comprises grinding the encapsulation material.

14. The method of claim 1,
    wherein at least partially removing the at least one pillar comprises an etch process.

15. The method of claim 1,
    wherein forming the plurality of trenches comprises an etch process.

16. A method of processing a wafer, the method comprising:
    separating a plurality of dies from a wafer by forming a trench structure into the wafer, the trench structure comprising at least two trenches provided between two adjacent dies of the plurality of dies, respectively; the at least two trenches forming a fin structure between the respective two adjacent dies of the plurality of dies;
    forming a wafer level package by at least partially encapsulating the plurality of dies separated from the wafer and by at least partially encapsulating the fin structure with encapsulation material; and
    removing the fin structure from the wafer level package to singulate the plurality of at least partially encapsulated dies from the wafer level package.

17. The method of claim 16,
    wherein removing the fin structure comprises at least partially exposing the fin structure and etching the fin structure.

18. The method of claim 16, further comprising:
    providing an auxiliary carrier to support the plurality of separated dies and to support the fin structure.

19. A method of processing a substrate, the method comprising:
    providing an auxiliary carrier on a substrate, the substrate comprising a plurality of integrated circuit structures;
    forming a trench structure into the substrate to separate said integrated circuit structures and to provide a fin structure between adjacent integrated circuit structures of said integrated circuit structures; the auxiliary carrier supporting the plurality of integrated circuit structures and the fin structure;
    filling at least the trench structure with encapsulation material, thereby at least partially encapsulating the integrated circuit structures; and
    removing the fin structure to separate the at least partially encapsulated integrated circuit structures.

* * * * *